(12) United States Patent
Sato

(10) Patent No.: US 6,175,132 B1
(45) Date of Patent: Jan. 16, 2001

(54) SEMICONDUCTOR MEMORY DEVICE AND METHOD OF FABRICATING THE SAME

(75) Inventor: Natsuki Sato, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/416,057

(22) Filed: Oct. 12, 1999

(30) Foreign Application Priority Data

Oct. 13, 1998 (JP) ................................. 10-290505

(51) Int. Cl.[7] ................ H01L 27/08; H01L 29/76; H01L 29/94; H01L 31/119
(52) U.S. Cl. .................. 257/306; 257/296; 257/298
(58) Field of Search .................... 257/306, 296, 257/298

(56) References Cited

U.S. PATENT DOCUMENTS

| | | |
|---|---|---|
| 5,796,136 | * 8/1998 | Shinkawata . |
| 5,811,849 | * 9/1998 | Matsuura . |
| 5,914,512 | * 6/1999 | Huang . |
| 5,923,062 | * 7/1999 | Ohno . |
| 5,965,939 | * 10/1999 | Kim et al. . |

FOREIGN PATENT DOCUMENTS

| | | |
|---|---|---|
| 4-82263 | 3/1992 | (JP) . |
| 4-87366 | 3/1992 | (JP) . |
| 6-5803 | 1/1994 | (JP) . |
| 6-216332 | 8/1994 | (JP) . |

* cited by examiner

Primary Examiner—Stephen D. Meier
(74) Attorney, Agent, or Firm—McGinn & Gibb, PLLC

(57) ABSTRACT

There is provided a semiconductor memory device including (a) at least one electrode such as a gate electrode, (b) a first region in which a memory cell is formed, and (c) a second region in which a peripheral circuit is formed and which is adjacent to the first region. A sloped or stepped region is formed at a boundary between the first and second regions. The electrode is designed to have a projecting portion projecting upwardly in the sloped or stepped region. The semiconductor memory device eases steep of the sloped or stepped region. In addition, since the semiconductor memory device includes no additional elements to decrease the angle, the semiconductor memory device remains to have the same area as an area of a conventional semiconductor memory device having a steeply sloped or stepped region.

21 Claims, 6 Drawing Sheets

SEMICONDUCTOR MEMORY DEVICE AND METHOD OF FABRICATING THE SAME

BACKGROUND OF THE INVENTION

1. Field of the Invention

The invention relates to an improvement in a semiconductor memory such as a dynamic random access memory having a stacked capacity, which has a sloped or stepped region at a boundary between a first region in which a memory cell is formed and a second region in which a peripheral circuit is formed.

2. Description of the Related Art

In these days, a dynamic random access memory (DRAM) device having a stacked capacity has been designed to include an accumulation electrode having an increased thickness, in order to ensure an accumulation capacity as much as possible. However, if an accumulation electrode is designed to have an increased thickness, it is unavoidable that a sloped or stepped region is formed at a boundary between a first region in which a memory cell is formed and a second region in which a peripheral circuit is formed.

In such a semiconductor memory device having a sloped or stepped region, it would be often impossible to ensure sufficient focus margin, and hence, it would be also impossible to pattern a wiring layer in a photolithography step to be carried out subsequent to formation of an accumulation electrode. In addition, such a semiconductor memory device is accompanied with a problem that some portions are not etched in an etching step. As a result, a resultant semiconductor memory device would have problems of breakage in a wiring and short-circuit. Furthermore, since it is quite difficult to accurately pattern a layer, design-rule for making a small-sized device cannot be applied to such a semiconductor memory device.

An example of a semiconductor memory device having a sloped or stepped region is illustrated in FIGS. 1 and 2.

The illustrated semiconductor memory device is comprised of a p-type semiconductor substrate 1, a field oxide film 2 formed at a surface of the p-type semiconductor substrate 1, gate electrodes 4 formed on the p-type semiconductor substrate 1, n-type diffusion layers 3 formed around the gate electrodes at a surface of the p-type semiconductor substrate 1, a first interlayer insulating film 5 covering the substrate 1 therewith, first contacts 6 formed throughout the first interlayer insulating film 5 and reaching the n-type diffusion layers 3, accumulation electrodes 7 formed on the first interlayer insulating film 5 and making electrical connection with the n-type diffusion layers 3 through the first contacts 6, a plate electrode 8 covering the accumulation electrodes 7 therewith, a second interlayer insulating film 9 formed on the plate electrode 8 and the first interlayer insulating film 5, a second contact 10 formed throughout the first and second interlayer insulating films 5 and 9, and reaching the n-type diffusion layer 3, and wiring layers 11, 12, 13 and 14 formed on the second interlayer insulating film 9.

As illustrated in FIG. 1, the semiconductor memory device has a first region in which a memory cell is formed and a second region in which a peripheral circuit is formed.

The illustrated semiconductor memory device is fabricated as follows.

First, a field oxide film 2 is formed on a p-type semiconductor substrate 1 by thermal oxidation by a thickness of 0.4 $\mu$m. An area surrounded by the field oxide film 2 defines an area in which a device is to be fabricated.

Then, an n-type polysilicon film is formed on the p-type semiconductor substrate 1 by a thickness of 0.2 $\mu$m. The thus deposited n-type polysilicon is patterned by photolithography to thereby form gate electrodes 4.

Then, the p-type semiconductor substrate 1 is ion-implanted with doses of about $5 \times 10^{13}$ phosphorus (P) $cm^{-2}$ in self-aligning fashion about the gate electrodes 4 and the field oxide film 2, to thereby form n-type diffusion layers 3 in the p-type semiconductor substrate 1.

Then, a first interlayer insulating film 5 is formed over the p-type semiconductor substrate 1, and subsequently, first contacts 6 are formed throughout the first interlayer insulating film 5 so that they reach the n-type diffusion layers 3.

Then, a doped polysilicon film is formed all over the first interlayer insulating film 5 by a thickness of 0.8 $\mu$m. The thus deposited polysilicon film is patterned to thereby form accumulation electrodes 7 on the first contacts 6.

Then, a capacitive insulating film (not illustrated) is formed over a resultant. Then, a polysilicon film is formed by a thickness of 0.2 $\mu$m, and is pattered into plate electrodes 8.

Then, a second interlayer insulating film 9 is deposited all over a resultant by a thickness of 0.5 $\mu$m. The second interlayer insulating film 9 is composed of BPSG (boron phospho silicate glass), for instance.

Then, wiring layers 11 to 14 are formed on the second interlayer insulating film 9. The wiring layers 11 to 14 are composed of aluminum, for instance.

Thus, there is completed the semiconductor memory device illustrated in FIGS. 1 and 2.

As illustrated in FIG. 1, there is formed a relatively steep stepped region 15 around a boundary between the first and second regions, specifically, in a region A sandwiched between the wiring layers 11 and 13. Thus, it is quite difficult to accurately pattern an aluminum film for forming the wiring layers 11 to 14. In particular, since a photoresist layer for making the wiring layer 12 located in the region A would have a great thickness in a photolithography step, it would be quite difficult to accurately pattern the aluminum film into the wiring layer 12.

In addition, there remains residue 19 of a wiring layer in the region A, after an etching step has been carried out.

There have been suggested many attempts to ease steep of the stepped region. For instance, Japanese Unexamined Patent Publications Nos. 4-82263, 4-87366, 6-5803, and 6-216332 have suggested a semiconductor memory device making attempts to ease steep of a stepped region formed between the first and second regions by forming a dummy pattern at a boundary between the first and second regions.

FIGS. 3 and 4 illustrate an example of a semiconductor memory device suggested in the above-mentioned Publications.

The illustrated semiconductor memory device is comprised of a p-type semiconductor substrate 1, a field oxide film 2 formed at a surface of the p-type semiconductor substrate 1, gate electrodes 4 formed on the p-type semiconductor substrate 1, n-type diffusion layers 3 formed around the gate electrodes at a surface of the p-type semiconductor substrate 1, a dummy gate pattern 16 formed above a field oxide film 2a, a first interlayer insulating film 5 covering the substrate 1 therewith, first contacts 6 formed throughout the first interlayer insulating film 5 and reaching the n-type diffusion layers 3, accumulation electrodes 7 formed on the first interlayer insulating film 5 and making electrical connection with the n-type diffusion layers 3 through the first contacts 6, a plate electrode 8 covering the accumulation electrodes 7 therewith, a second interlayer insulating film 9 formed on the plate electrode 8 and the first interlayer insulating film 5, a second contact 10 formed throughout the first and second interlayer insulating films 5 and 9, and reaching the n-type diffusion layer 3, and wiring layers 11, 12, 13 and 14 formed on the second interlayer insulating film 9.

In the semiconductor memory device illustrated in FIGS. 3 and 4, since the dummy gate pattern 16 is formed above the relatively long field oxide film 2a, steep 15a of the stepped region formed between the first and second regions is made smaller than the steep 15 of the stepped region in the semiconductor memory device illustrated in FIGS. 1 and 2.

However, a region B sandwiched between the wiring layers 11 and 13 in the semiconductor memory device illustrated in FIG. 3 is longer than the region A in the semiconductor memory device illustrated in FIG. 1. This means that the semiconductor memory device illustrated in FIG. 3 can ease steep of the stepped region in comparison with the semiconductor memory device illustrated in FIG. 1, but has to have a greater area than an area of the semiconductor memory device illustrated in FIG. 1 due to the dummy gate pattern 16.

SUMMARY OF THE INVENTION

It is an object of the present invention to provide a semiconductor memory device which can ease steep of a sloped or stepped region formed between a first region in which a memory cell is to be formed and a second region in which a peripheral circuit is to be formed, without an increase in an area of a semiconductor memory device.

It is also an object of the present invention to provide a method of fabricating such a semiconductor memory device.

In one aspect of the present invention, there is provided a semiconductor memory device, including (a) at least one electrode, (b) a first region in which a memory cell is formed, and (c) a second region in which a peripheral circuit is formed and which is adjacent to the first region, a sloped or stepped region being formed at a boundary between the first and second regions, the electrode having a projecting portion projecting upwardly in the sloped or stepped region.

For instance, the electrode may be a gate electrode or a plate electrode which partially constitutes an accumulation capacity.

For instance, the semiconductor memory device may be a dynamic random access memory (DRAM).

It is preferable that the electrode at least partially overlaps a field oxide film formed at a surface of a substrate.

There is further provided a semiconductor memory device, including (a) a substrate, (b) at least one first electrode formed on the substrate, (c) an interlayer insulating film covering the substrate and the first electrode therewith, (d) at least one second electrode formed on the interlayer insulating film, (e) a first region in which a memory cell is formed, and (f) a second region in which a peripheral circuit is formed and which is adjacent to the first region, a sloped or stepped region being formed at a boundary between the first and second regions, the first and second electrodes each having a projecting portion projecting upwardly in the sloped or stepped region.

It is preferable that the first and second electrodes at least partially overlap a field oxide film formed at a surface of the substrate, in which case, it is also preferable that the projecting portion of the first electrode overlaps the projecting portion of the second electrode above the field oxide film.

In another aspect of the present invention, there is provided a method of fabricating a semiconductor memory device, including the step of forming an electrode having a projecting portion projecting upwardly in a sloped or stepped region formed at a boundary between a first region in which a memory cell is formed and a second region in which a peripheral circuit is formed.

There is further provided a method of fabricating a semiconductor memory device including a first region in which a memory cell is formed, a second region in which a peripheral circuit is formed and which is adjacent to the first region, and a sloped or stepped region formed at a boundary between the first and second regions, including the steps of (a) forming at least one first electrode on a substrate so that the first electrode has a projecting portion projecting upwardly in the sloped or stepped region, (b) covering the substrate and the first electrode with an interlayer insulating film, and (c) forming at least one second electrode on the interlayer insulating film so that the second electrode has a projecting portion projecting upwardly in the sloped or stepped region.

It is preferable that the first and second electrodes are formed in the steps (a) and (c), respectively, so as to at least partially overlap a field oxide film formed at a surface of the substrate, in which case, it is also preferable that the second electrode is formed in the step (c) in such a manner that the projecting portion of the second electrode overlaps the projecting portion of the first electrode above the field oxide film.

The advantages obtained by the aforementioned present invention will be described hereinbelow.

The semiconductor memory device in accordance with the present invention eases an angle of a stepped region formed between a region in which a memory cell is to be formed and a region in which a peripheral circuit is to be formed, by means of an electrode or electrodes which is(are) indispensable for a semiconductor memory device. Hence, the semiconductor memory device remains to have the same area as an area of a conventional semiconductor memory device having a steeply sloped or stepped region. Thus, the semiconductor memory device in accordance with the present invention has an eased stepped region without an increase in an area of a device.

In addition, it is possible to ease an angle of a stepped region to a further degree, by overlapping projecting portions each other in two or more layers.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 5:
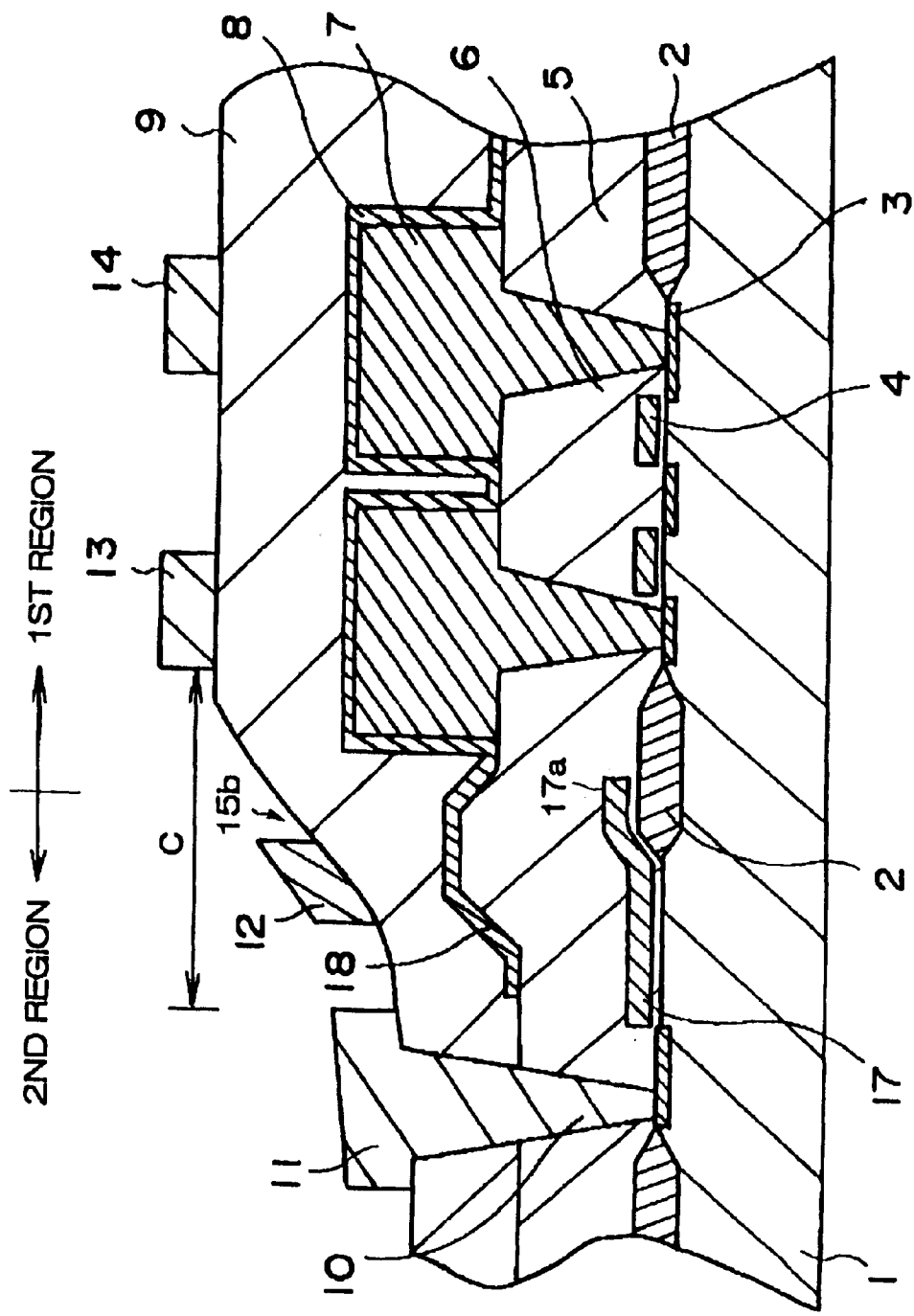
FIG. 5 is a cross-sectional view of a semiconductor memory device in accordance with an embodiment of the present invention.
Figure 6:
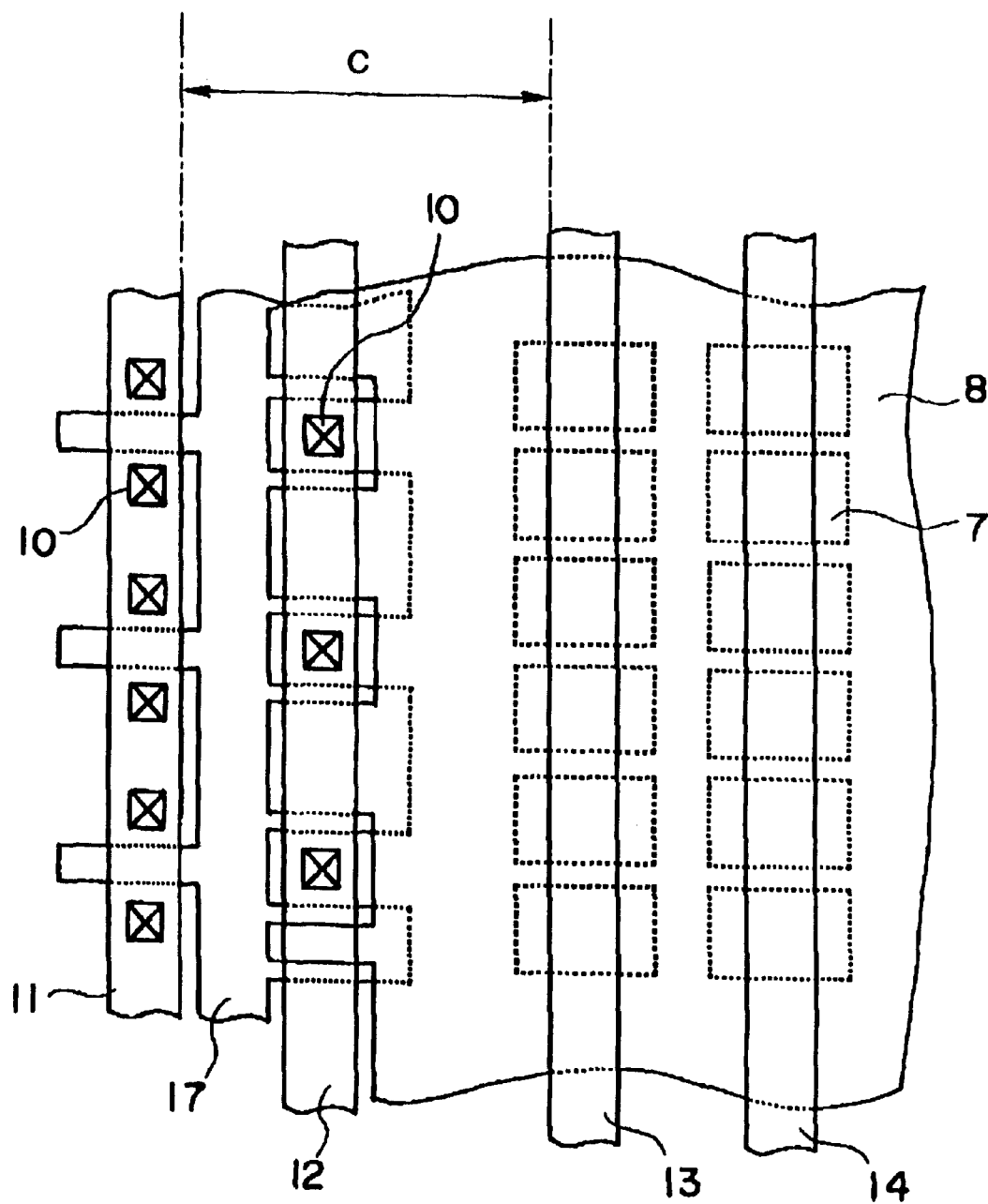
FIG. 6 is a top plan view of the semiconductor memory device illustrated in FIG. 5.

FIGS. 5 and 6 illustrate a semiconductor memory device in accordance with an embodiment of the present invention. The semiconductor memory device in accordance with the embodiment is a dynamic random access memory (DRAM).

As illustrated in FIG. 5, the semiconductor memory device in accordance with the embodiment is comprised of a p-type semiconductor substrate 1, a field oxide film 2 formed at a surface of the p-type semiconductor substrate 1, gate electrodes 4 formed on the p-type semiconductor substrate 1, n-type diffusion layers 3 formed around the gate electrodes at a surface of the p-type semiconductor substrate 1, a first interlayer insulating film 5 covering the substrate 1 therewith, first contacts 6 formed throughout the first interlayer insulating film 5 and reaching the n-type diffusion layers 3, accumulation electrodes 7 formed on the first interlayer insulating film 5 and making electrical connection with the n-type diffusion layers 3 through the first contacts 6, a plate electrode 8 covering the accumulation electrodes 7 therewith, a second interlayer insulating film 9 formed on the plate electrode 8 and the first interlayer insulating film 5, a second contact 10 formed throughout the first and second interlayer insulating films 5 and 9, and reaching the n-type diffusion layer 3, and wiring layers 11, 12, 13 and 14 formed on the second interlayer insulating film 9.

As illustrated in FIG. 5, the semiconductor memory device has a first region in which a memory cell is formed and a second region in which a peripheral circuit is formed.

The n-type diffusion layer 3 and the gate electrodes 4 cooperate with each other to constitute a MOS transistor. The accumulation electrodes 7 are electrically insulated from the plate electrode 8 by an insulating film (not illustrated). The accumulation electrodes 7, the plate electrode 8, and the insulating film cooperate with one another to thereby constitute an accumulative capacity. The wiring layer 12 makes electrical connection with the n-type diffusion layer (not illustrated) through the second contact 10.

The semiconductor memory device in accordance with the embodiment is designed to include a gate electrode 17 located at a boundary between the first and second regions and above the field oxide film 2. The gate electrode partially overlaps the field oxide film 2. The gate electrode 17 is designed to have a projecting portion 17a projecting upwardly in a region C sandwiched between the wiring layers 11 and 13 and including the boundary between the first and second regions.

The plate electrode 8 is designed to have a projecting portion 18 projecting upwardly in the region C.

The projection portions 17a and 18 are located so as not to interfere with the second contact 10.

The projecting portion 18 of the plated electrode 8 overlaps the projecting portion 17a of the gate electrode 17 above the field oxide film 2. Hence, the first and second interlayer insulating films 5 and 9 are raised in the region C, and an slope angle of a stepped region 15C is smaller than the angles of the stepped regions A and B illustrated in FIGS. 1 and 3, respectively.

Accordingly, a photoresist film is not residual in a photolithography step carried out for forming the wiring layers 11 to 14 on the second insulating film 9, and unnecessary portions of the wiring layers do not remain non-etched in an etching step.

Figure 1:
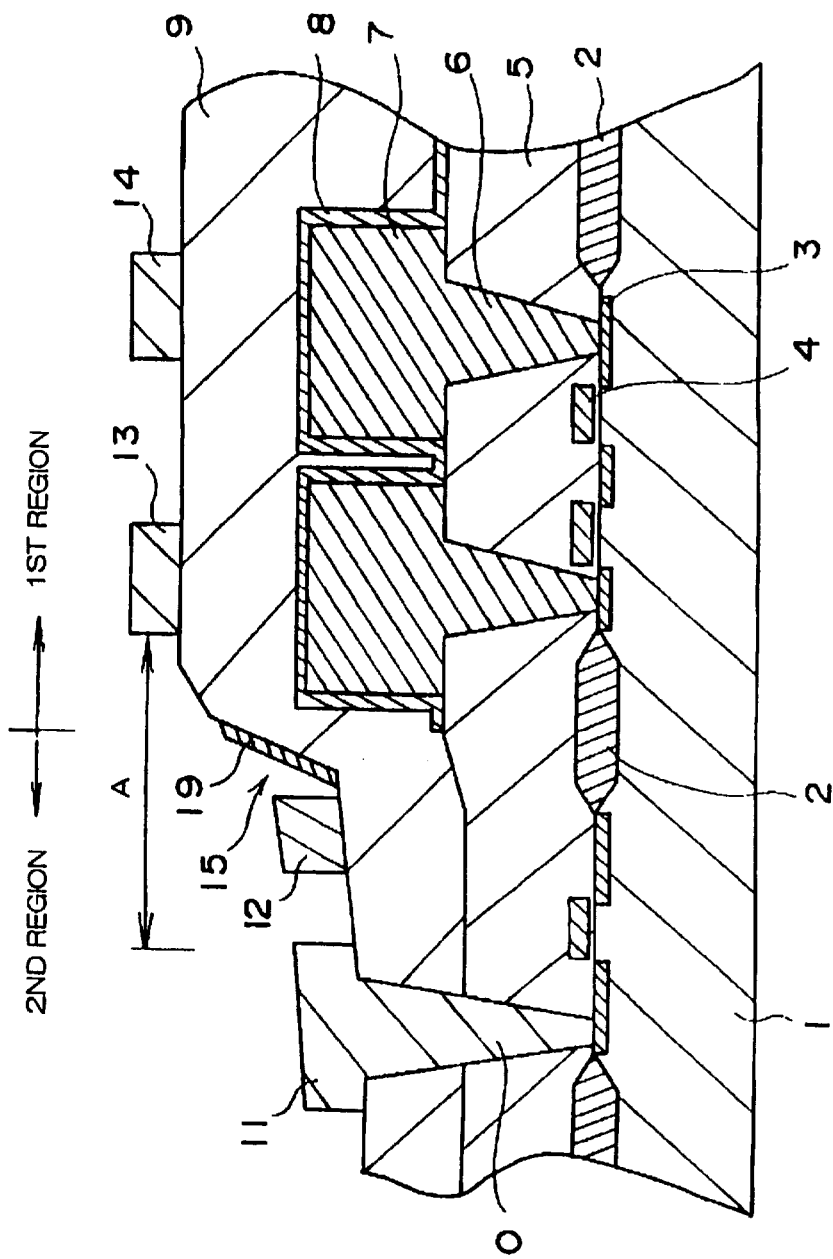
FIG. 1 is a cross-sectional view of a conventional semiconductor memory device.
Figure 2:
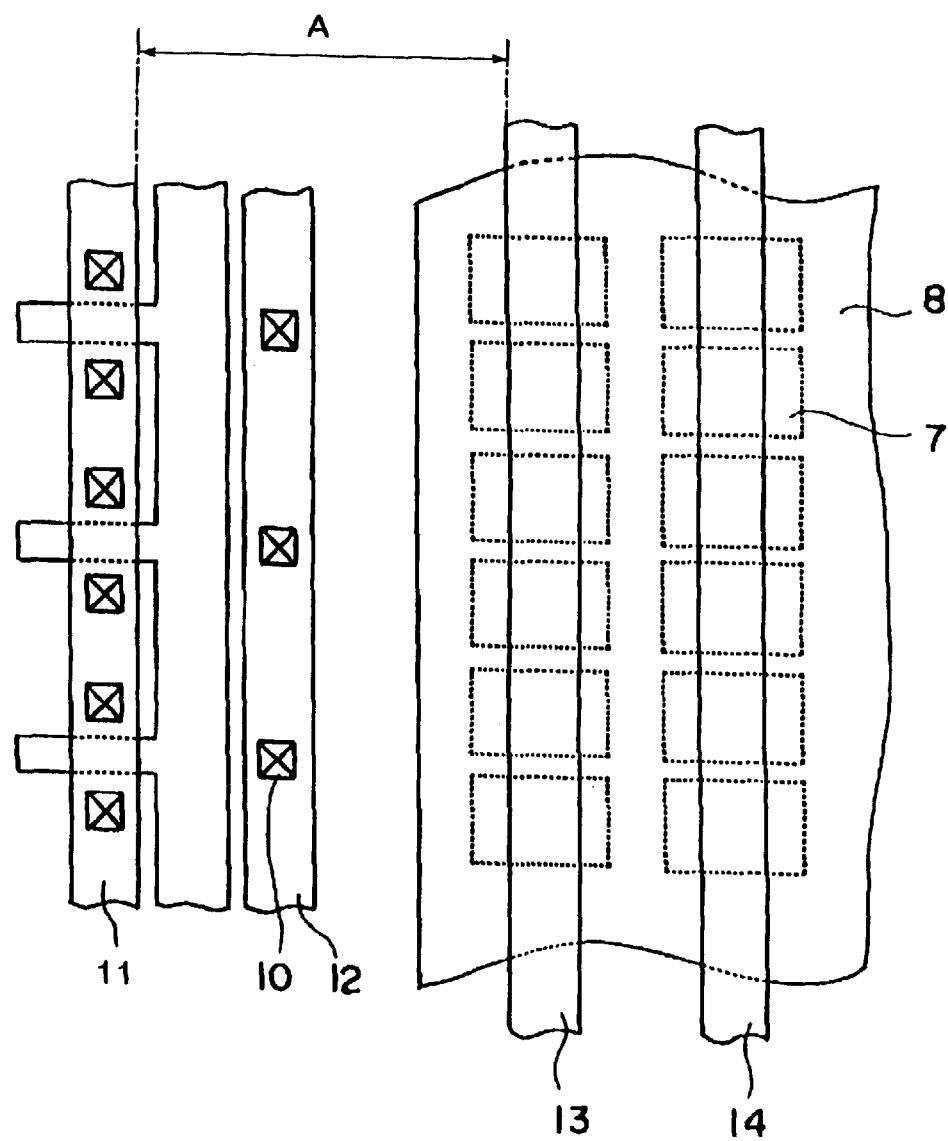
FIG. 2 is a top plan view of the semiconductor memory device illustrated in FIG. 1.
Figure 3:
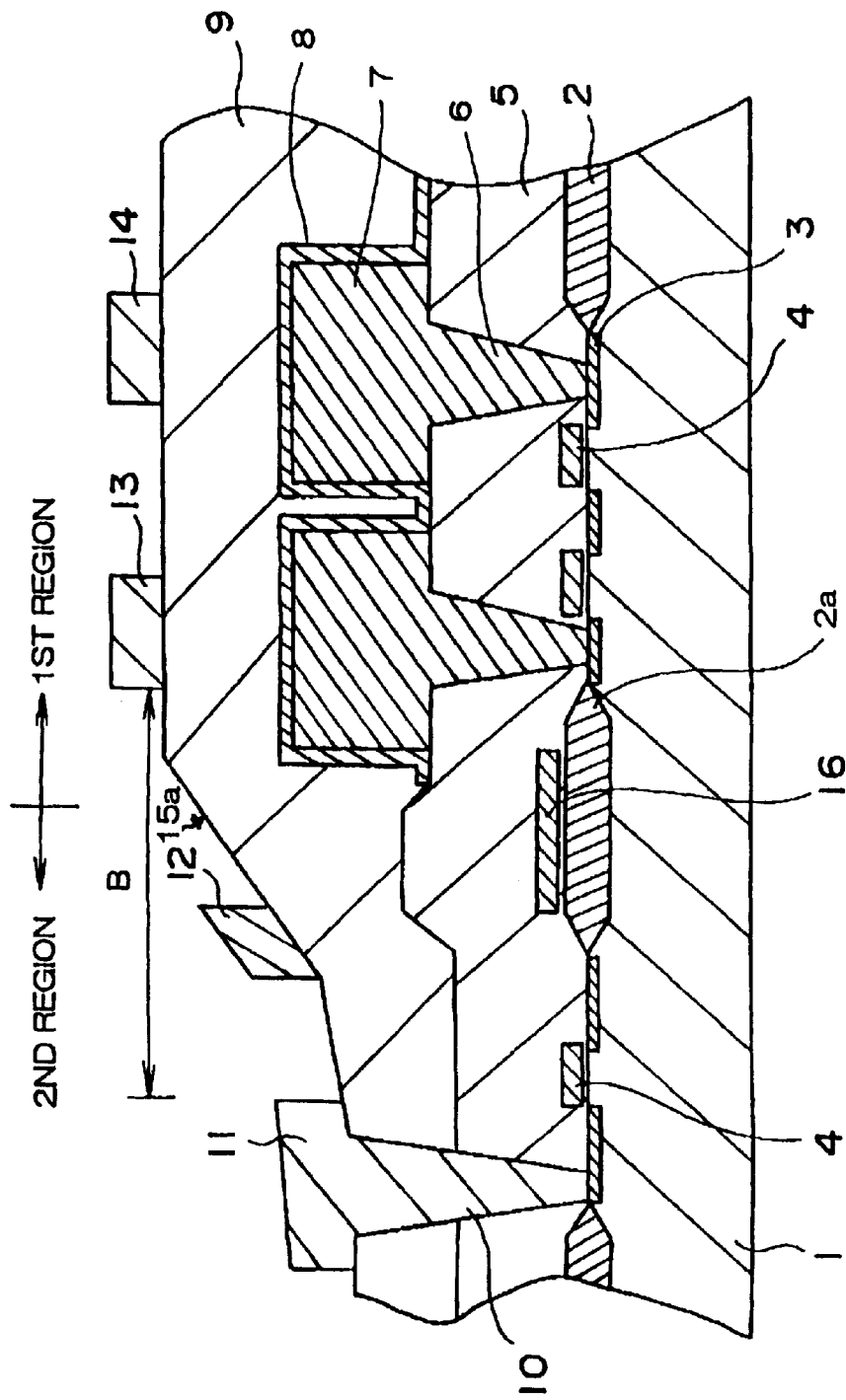
FIG. 3 is a cross-sectional view of another conventional semiconductor memory device.
Figure 4:
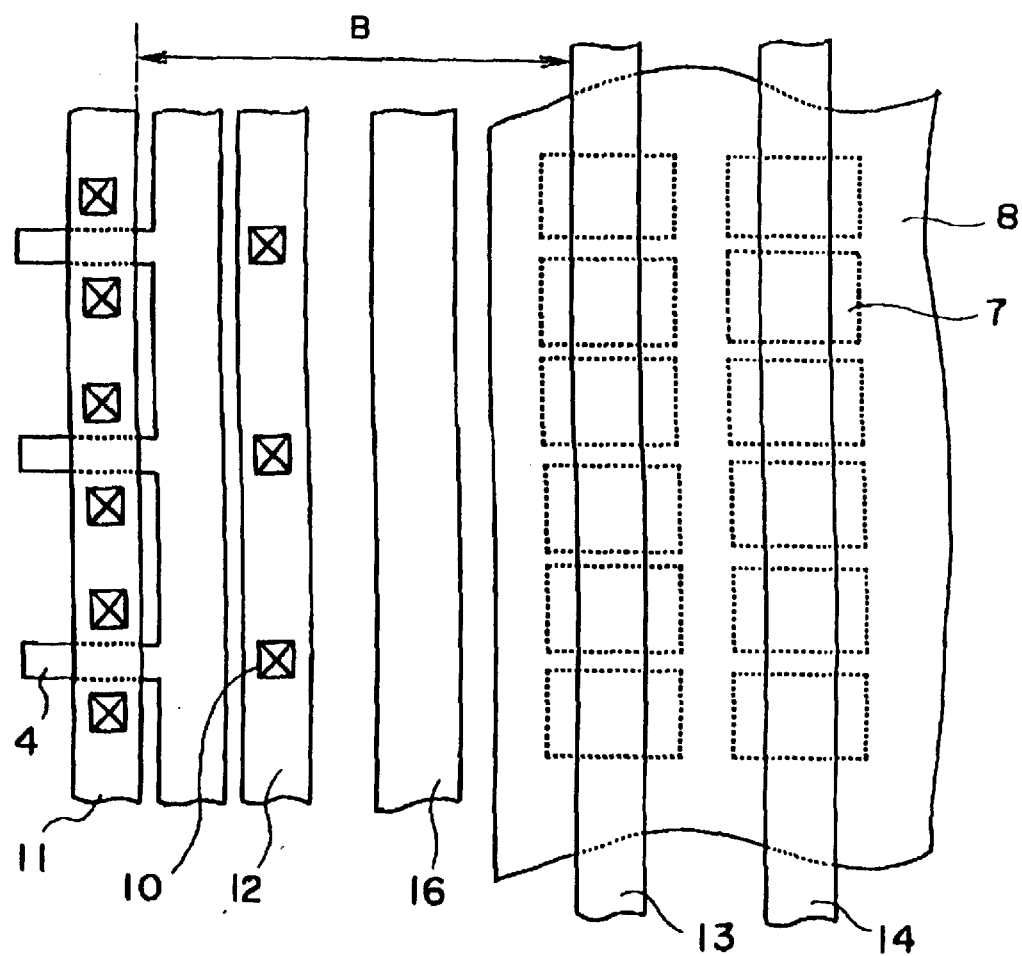
FIG. 4 is a top plan view of the semiconductor memory device illustrated in FIG. 3.

The region C in the embodiment has the same length as a length of the region A illustrated in FIG. 1, and is smaller than a length of the region B illustrated in FIG. 3.

The semiconductor memory device in accordance with the embodiment is fabricated as follows.

First, a field oxide film 2 is formed on a p-type semiconductor substrate 1 by thermal oxidation by a thickness of 0.4 µm. An area surrounded by the field oxide film 2 defines an area in which a device is to be fabricated.

Then, an n-type polysilicon film is formed on the p-type semiconductor substrate 1 by a thickness of 0.2 µm. The thus deposited n-type polysilicon is patterned by photolithography to thereby form both gate electrodes 4 and a gate electrode 17 having a projecting portion 17a projecting upwardly in the region C.

Then, the p-type semiconductor substrate 1 is ion-implanted with doses of about $5 \times 10^{13}$ phosphorus (P) cm$^{-2}$ in self-aligning fashion about the gate electrodes 4 and the field oxide film 2, to thereby form n-type diffusion layers 3 in the p-type semiconductor substrate 1.

Then, a first interlayer insulating film 5 is formed over the p-type semiconductor substrate 1, and subsequently, first contacts 6 are formed throughout the first interlayer insulating film 5 so that they reach the n-type diffusion layers 3.

Then, a doped polysilicon film is formed all over the first interlayer insulating film 5 by a thickness of 0.8 µm. The thus deposited polysilicon film is patterned to thereby form accumulation electrodes 7 on the first contacts 6.

Then, a capacitive insulating film (not illustrated) is formed over a resultant. Then, a polysilicon film is formed by a thickness of 0.2 µm, and is pattered into plate electrodes 8 and a projection portion 18 projecting upwardly in the region C.

Then, a second interlayer insulating film 9 is deposited all over a resultant by a thickness of 0.5 µm. The second interlayer insulating film 9 is composed of BPSG (boron phospho silicate glass), for instance.

Then, wiring layers 11 to 14 are formed on the second interlayer insulating film 9. The wiring layers 11 to 14 are composed of aluminum, for instance.

Thus, there is completed the semiconductor memory device in accordance with the embodiment, illustrated in FIG. 5.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-290505 filed on Aug. 13, 1998 including specification, claims, drawings and summary is incorporated herein by reference in its entirety.

What is claimed is:

1. A semiconductor memory device comprising:
   a substrate;
   at least one electrode formed on said substrate;
   an interlayer insulating film covering said substrate and said electrode therewith;
   a first region in which a memory cell is formed and which has a first thickness;
   a second region in which a peripheral circuit is formed and which is adjacent to said first region and has a second thickness which is less than said first thickness; and
   a sloped or stepped region formed at a boundary between said first and second regions,
   wherein said electrode has a projecting portion projecting upwardly in said sloped or stepped region, and
   wherein said projecting portion raises said interlayer insulating film, for minimizing a slope angle of said sloped or stepped region.

2. The semiconductor memory device as set forth in claim 1, wherein said electrode is a gate electrode.

3. The semiconductor memory device as set forth in claim 1, wherein said electrode is a plate electrode which partially constitutes an accumulation capacity.

4. The semiconductor memory device as set forth in claim 1, wherein said semiconductor memory device is a dynamic random access memory (DRAM).

5. The semiconductor memory device as set forth in claim 1, further comprising:
   a field oxide film formed on said substrate,
   wherein said electrode at least partially overlaps said field oxide film.

6. A semiconductor memory device as set forth in claim 1, wherein the slope angle of a surface of said sloped or stepped region is decreased without increasing the area of said semiconductor memory device.

7. A semiconductor memory device as set forth in claim 1, further comprising:
   at least one wiring layer formed on a surface of said sloped or stepped region.

8. A semiconductor memory device as set forth in claim 7, wherein said wiring layer comprises aluminum.

9. A semiconductor memory device as set forth in claim 1, further comprising:
   an accumulation electrode which is formed in said first region and has a thickness of at least 0.8 µm.

10. A semiconductor memory device comprising:
    a substrate;
    at least one first electrode formed on said substrate;
    a first interlayer insulating film covering said substrate and said first electrode therewith;
    at least one second electrode formed on said first interlayer insulating film;
    a second interlayer insulating film covering at least said second electrode;
    a first region in which a memory cell is formed and which has a first thickness;
    a second region in which a peripheral circuit is formed and adjacent to said first region and which has a second thickness which is less than said first thickness; and
    a sloped or stepped region formed at a boundary between said first and second regions,
    wherein said first and second electrodes each have a projecting portion projecting upwardly in said sloped or stepped region, and
    wherein said projecting portion of said first electrode raises said first interlayer insulating film and said second electrode raises said second interlayer insulating film, for minimizing a slope angle of said sloped or stepped region.

11. The semiconductor memory device as set forth in claim 10, wherein said electrode is a gate electrode.

12. The semiconductor memory device as set forth in claim 10, wherein said electrode is a plate electrode which partially constitutes an accumulation capacity.

13. The semiconductor memory device as set forth in claim 10, wherein said semiconductor memory device is a dynamic random access memory (DRAM).

14. The semiconductor memory device as set forth in claim 10, further comprising:
    a field oxide film formed on said substrate,
    wherein said first and second electrodes at least partially overlap said field oxide film.

15. The semiconductor memory device as set forth in claim 14, wherein said projecting portion of said second electrode overlaps said projecting portion of said first electrode above said field oxide film.

16. A semiconductor memory device as set forth in claim 10, wherein the slope angle of a surface of said sloped or stepped region is decreased without increasing the area of said semiconductor memory device.

17. A semiconductor memory device as set forth in claim 10, further comprising:
    at least one wiring layer formed on a surface of said sloped or stepped region.

18. A semiconductor memory device as set forth in claim 17, wherein said wiring layer comprises aluminum.

19. A semiconductor memory device as set forth in claim 10, further comprising:
    an accumulation electrode which is formed in said first region and has a thickness of at least 0.8 µm.

20. A semiconductor memory device comprising:

a substrate;

a field oxide film formed on said substrate;

at least one electrode formed on said substrate and partially overlapping said field oxide film;

an interlayer insulating film covering said substrate and said electrode therewith;

a first region in which a memory cell is formed and which has a first thickness;

a second region in which a peripheral circuit is formed and which is adjacent to said first region and has a second thickness which is less than said first thickness; and a sloped or stepped region formed at a boundary between said first and second regions, wherein said electrode has a projecting portion projecting upwardly in said sloped or stepped region, wherein said projecting portion raises said interlayer insulating film for minimizing a slope angle of said sloped or stepped region.

21. A semiconductor memory device comprising:

a substrate;

a field oxide film formed on said substrate;

at least one first electrode formed on said substrate and partially overlapping said field oxide film;

a first interlayer insulating film covering said substrate and said first electrode therewith;

at least one second electrode formed on said first interlayer insulating film and partially overlapping said field oxide film;

a second interlayer insulating film covering at least said second electrode;

a first region in which a memory cell is formed and which has a first thickness;

a second region in which a peripheral circuit is formed and adjacent to said first region and which has a second thickness which is less than said first thickness; and a sloped or stepped region formed at a boundary between said first and second regions, wherein said first and second electrodes each have a projecting portion projecting upwardly in said sloped or stepped region, wherein said projecting portion of said first electrode raises said first interlayer insulating film and said second electrode raises said second interlayer insulating film, for minimizing a slope angle of said sloped or stepped region.

* * * * *